(12) United States Patent
Leins

(10) Patent No.: US 7,149,988 B2
(45) Date of Patent: Dec. 12, 2006

(54) IDENTIFYING HIGH E-FIELD STRUCTURES

(75) Inventor: Michael Leins, Boston, MA (US)

(73) Assignee: Dell Products L.P., Round Rock, TX (US)

( * ) Notice: Subject to any disclaimer, the term of this patent is extended or adjusted under 35 U.S.C. 154(b) by 155 days.

(21) Appl. No.: 11/043,721

(22) Filed: Jan. 26, 2005

(65) Prior Publication Data

US 2006/0190855 A1   Aug. 24, 2006

(51) Int. Cl.
*G06F 17/50* (2006.01)

(52) U.S. Cl. .................. 716/4; 716/1; 716/18
(58) Field of Classification Search ............ 716/1, 716/2, 4, 18
See application file for complete search history.

(56) References Cited

U.S. PATENT DOCUMENTS

| 6,744,434 B1 | 6/2004 | Kindratenko et al. ....... 345/423 |
| 2004/0120571 A1 | 6/2004 | Duvdevani et al. ......... 382/149 |
| 2004/0126005 A1 | 7/2004 | Duvdevani et al. ......... 382/149 |
| 2004/0165762 A1 | 8/2004 | Messina et al. ............. 382/141 |
| 2005/0132306 A1* | 6/2005 | Smith et al. ................... 716/1 |

\* cited by examiner

*Primary Examiner*—Thuan Do
(74) *Attorney, Agent, or Firm*—Baker Botts L.L.P.

(57) ABSTRACT

Power plane structures that may generate high E-fields can be identified and flagged for additional review by representing a boundary of the structures as a function, and evaluating the second derivative of that function. The result can be compared against a threshold value to determine if further review of the structure is desirable.

21 Claims, 3 Drawing Sheets

IDENTIFYING HIGH E-FIELD STRUCTURES

TECHNICAL FIELD

The present disclosure relates generally to identifying high electromagnetic field (E-field) structures, and more particularly to identifying high E-field structures by evaluating the second derivative of a function representing a boundary of the structures.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many of these information handling systems include multilayer circuit boards. Layers of the circuit board may interact with each other through capacitive coupling, which can improve circuit operation through adequate power delivery. Particularly for circuit boards used in conjunction with high frequency components, e.g. high speed microprocessors, the effect of capacitive coupling helps improve the operation of these microprocessors.

The capacitance between the layers of the multilayer circuit board can be increased by decreasing the distance between the layers as far as possible, without short-circuiting the layers. Placing the layers closer together increases the capacitance between the layers, thereby presenting a lower impedance to high frequency signals and providing improved high frequency power delivery.

Spacing the layers too closely, however, may result in a breakdown of the dielectric between the layers if a power plane includes structures that generate high electromagnetic fields (E-fields). To reduce the risk of dielectric breakdown, power plane designs are often inspected visually to identify high E-field structures, which can be identified by their "pointiness." Since more pointy structures may accumulate and focus electric charge more readily than less pointy structures, power plane structures that are visually identified as pointy may be replaced with less pointy structures.

SUMMARY

In accordance with teachings of the present disclosure, a system and method are described for identifying high electromagnetic field (e-field) structures formed on a power plane of a circuit board. The boundary of the structure formed on the power plane is represented as a mathematical function, and the second derivative of the function is evaluated. If the second derivative of the function exceeds a threshold, the structure which boundary is associated with the mathematical function may be a high E-field structure.

A description of the structure may be obtained from a computer aided drafting (CAD) file which may contain, for example, X-Y coordinates associated with the boundary of the structure. The coordinates obtained from the CAD file may be used in conjunction with a best-fit process to determine a mathematical function describing the boundary of the structure under consideration. Other embodiments represent the boundary of the structure as a composite boundary made up of a number of geometric objects, for example the boundary of the structure may be represented best as a combination of two circles.

After obtaining the function representing the boundary of the structure, the second derivative of the function is taken, in a manner well known to those skilled in the art. The second derivative may be compared to a threshold value obtained based on user input, or based on some predetermined value. The threshold value can be set to identify a particular level of pointiness associated with the structure being evaluated. This pointiness may correspond to an estimated, theoretically or empirically determined level of electromagnetic field strength generated.

Various embodiments of the present disclosure take the form of a circuit board, which may, in at least one embodiment, include a motherboard. The circuit board may be a multilayer circuit board constructed according to the methods described herein. Furthermore, in at least one embodiment of the disclosure, an information handling system is provided. The information handling system includes a circuit board, for example a motherboard, constructed according to a process described herein or its equivalent.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 6, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
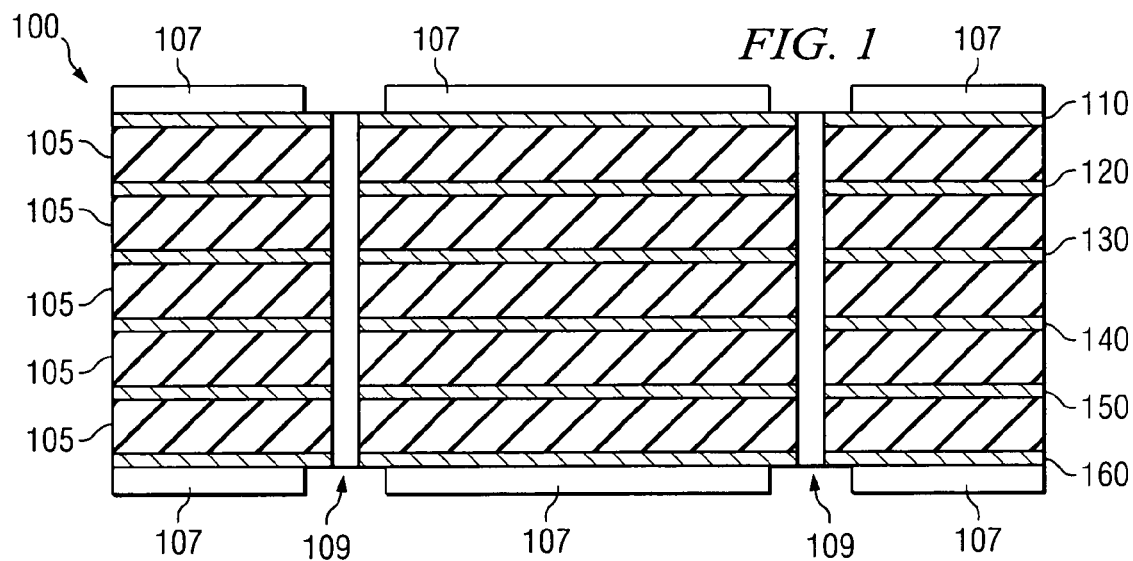
FIG. 1 is a diagram representing a cross-section of a multilayer circuit board including a reduced number of high E-field structures according to an embodiment of the present disclosure.

Referring first to FIG. 1, a multilayer printed circuit board (PCB) 100 is illustrated according to an embodiment of the present disclosure. PCB 100 includes signal layers 110, 120, 150, and 160, which are used to transfer and interconnect signals to different portions of PCB 100. PCB 100 also includes power plane 130 and ground plane 140. Power plane 130 may be used to route power to various portions of PCB 100 while ground plane 140 may be used to provide a reference voltage level. Signal layers 110, 120, 150 and 160, as well as power plane 130 and ground plane 140 are separated from the other layers of PCB 100 by core material 105. Core material 105 may be FR-4 glass, woven glass, ceramic, or other another dielectric material deemed appropriate based on insulation, capacitance, temperature performance, or other requirements of PCB 100.

Solder masks 107 are illustrated on the top and bottom of PCB 100, and may be formed over lands or pads (not illustrated) to allow solder mounting of surface mount components to PCB 100. Vias 109 are provided to permit mounting of through-hole technology (THT) components on PCB 100 by inserting component leads into the vias, and filling the vias and surrounding lands with solder.

In an least some embodiments, power plane 130 and ground plane 140 are placed as close to each other as possible so that the capacitance between power plane 130 and ground plane 140 is increased, thereby providing for improved power delivery at high frequencies. It should be appreciated that the order of layers illustrated in FIG. 1 is exemplary only. Power plane 130 and ground plane 140 may have, for example, signal transfer layers placed between them in some embodiments. Furthermore, multiple power planes 130 and/or multiple ground planes 140 may be employed consistent with design criteria of PCB 100. Furthermore, although vias 109 are shown traversing the entire width of PCB 100, other via types may be formed within PCB 100, or surface mount technology (SMT) components may be used to avoid the use of vias 109.

Figure 2:
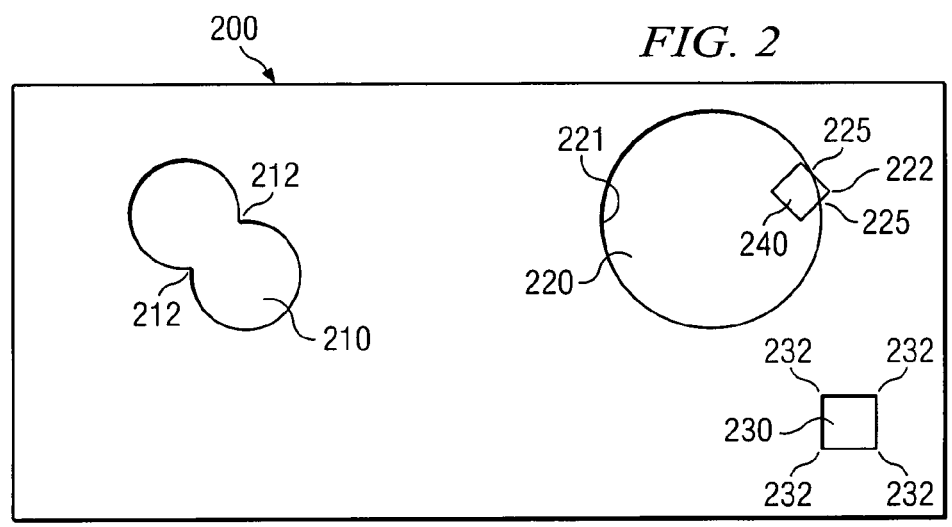
FIG. 2 is a diagram illustrating a plan view of a power plane having various pointy structures that may be flagged as high electromagnetic field structures according to an embodiment of the present disclosure.

Referring next to FIG. 2, a top view of a power plane 200 including various structures formed thereon is illustrated according to an embodiment of the present disclosure. Each of the illustrated structures has some feature that may be considered as a pointy portion of the structure, and may therefore result in the structure being considered to be a high E-field structure. For example, structure 210 includes pointy portions 212. Structure 220 includes pointy portions 222 and 225, and structure 230 includes pointy portions 232.

Each of these pointy portions may develop high E-fields if power plane 200 is placed in close enough proximity to a ground plane, or to another layer having a different voltage potential than power plane 200. To reduce the risk of structures 210, 220, and 230 generating high e-fields that may cause dielectric failure, the structures on power plane 200 may be identified as possible high E-field structures during the design process.

Figure 3:
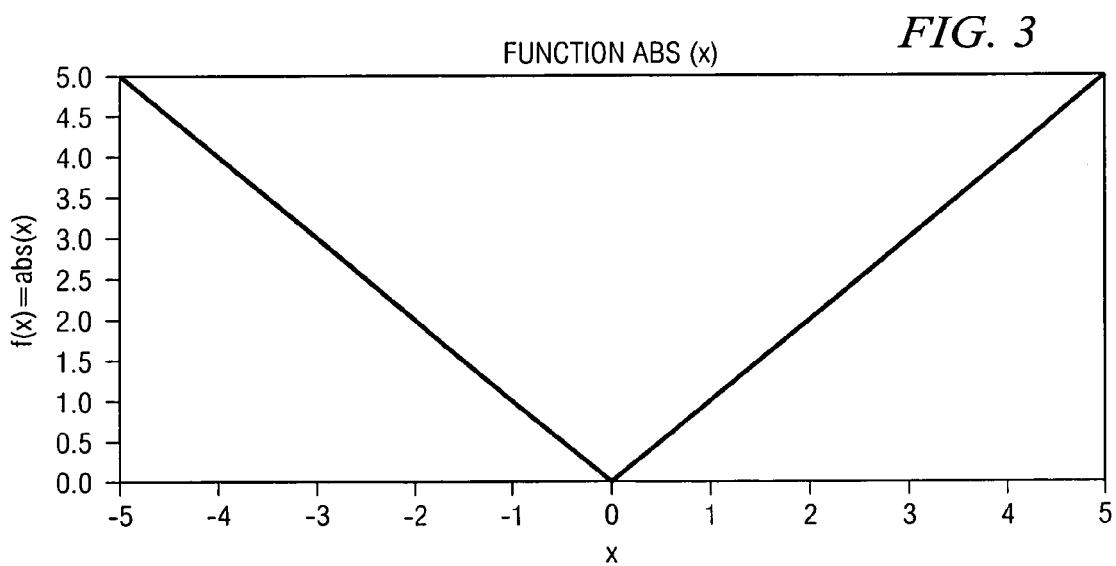
FIG. 3 is a graph of a function representing a portion of a pointy structure according to an embodiment of the present disclosure.
Figure 4:
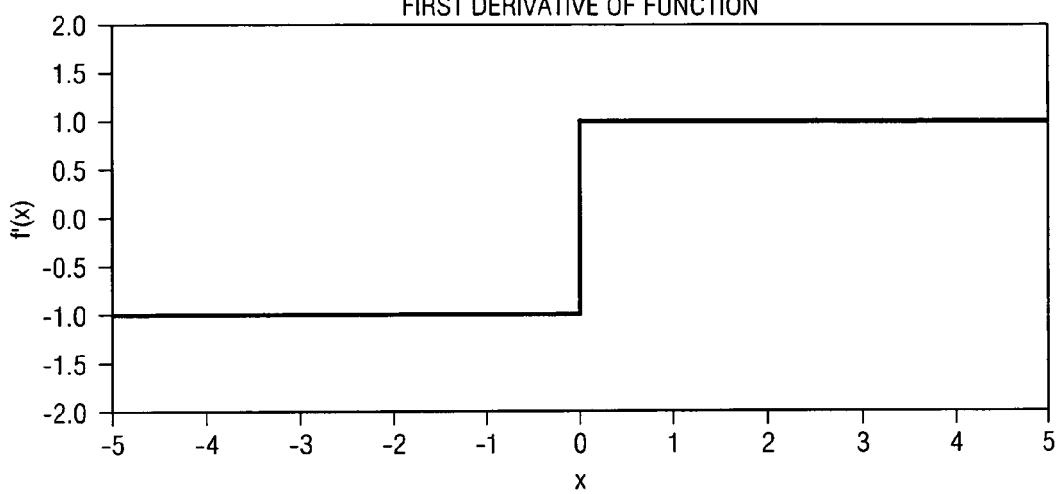
FIG. 4 is a graph of a first derivative of a function representing a portion of a pointy structure according to an embodiment of the present disclosure.

As known to those skilled in the art, the derivative of a mathematical function can be considered to be the slope of that function, and represents the rate at which that function changes with respect to a reference axis. Refer briefly to FIGS. 3 and 4, which illustrate, respectively, a mathematical function $f(x)=abs(x)$ and the first derivative $f'(x)$ of the mathematical function $f(x)$. Notice that $f(x)$ has a constant slope of $-1$ between $x=-5$ and $x=0$, and a constant slope of 1 between $x=0$ and $x=5$. Consequently, the first derivative $f'(x)=-1$ between $x=-5$ and $x=0$, and $f'(x)=1$ between $x=0$ and $x=5$. Note, however, that there is a discontinuity in $f'(x)$ at $x=0$. The second derivative (not illustrated) $f''(x)$ is 0 everywhere except at $x=0$, where $f'(x)$ is undefined (or infinitely large). Those skilled in the art will appreciate that the more abruptly $f(x)$ changes, the more abruptly $f'(x)$ changes, and the greater the absolute value of $f''(x)$.

Referring again to FIG. 2, the degree of pointiness, and therefore the likelihood that a structure will be considered to be a high E-field structure, may be determined based on the value of the second derivative of a function representing the boundary of the structure. Thus, for gently rounded portions of the boundary of structure 210, which may be modeled as portions of a unit circle ($f(x)=x^2+y^2$) the second derivative will be a constant value of 2. However, at pointy portions 212 (approximately $f(x)=abs(x)$), the second derivative will be very large, e.g. tending towards infinity, and possibly undefined.

Referring next to structure 220 of FIG. 2, pointy portion 222 will be very large, or undefined, while pointy portions 225 will be larger than zero. But not as large as portion 222, since portions 225 are not as pointy as portion 222.

Note that structure 220 is illustrated as a combination of two geometric shapes: a circle 221, and a square 240. In at least one embodiment of the present disclosure, the boundary definition of structure 220 obtained from a CAD program or other design type program can be approximated by combining circle 221 and square 240. In other embodiments, however, the X-Y coordinates of each point defining the boundary of structure 220 can be used to develop a function representing the boundary of the structure.

Structure 230 is a simple square, and as such has four pointy portions 232, one at each corner of the square. The second derivative of the function describing the boundary of structure 230 will be approximately infinite, or undefined at points 232.

Although the second derivative has been described as undefined, or infinite at very pointy portions along the boundary of various structures, due to the way in which many processors, and/or software programs handle mathematical functions, very large values for the second derivative of a function may be returned instead of infinity. Those skilled in the art will appreciate that very large values of a second derivative may be interpreted, in some instances, as equivalent to an infinite or undefined second derivative.

It should be appreciated that power plane 200, although illustrating particular structures 210, 220 and 230, is not limited to including only those structures illustrated. Other structures that may be formed of more complex geometric shapes, or that may be defined using X-Y coordinates provided by a design tool, or otherwise, may be included on a power, ground, or other type plane.

Figure 5:
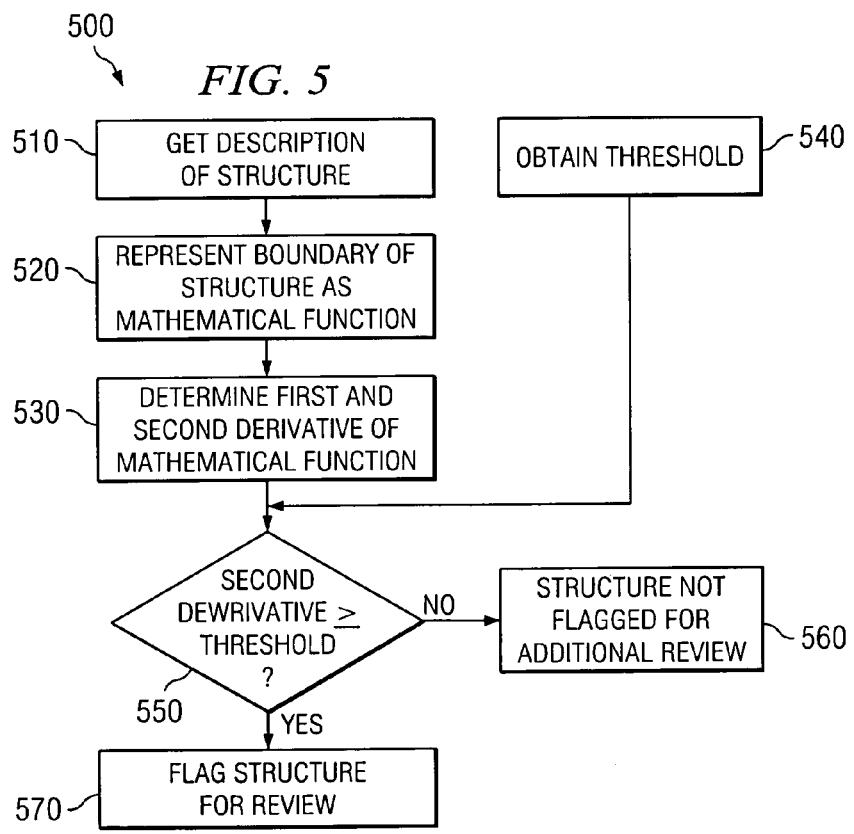
FIG. 5 is a flow diagram illustrating a method according to an embodiment of the present disclosure.

Referring next to FIG. 5, a method 500 according to an embodiment of the present disclosure will be discussed. Method 500 begins at 510, which obtains a description of a structure on a power plane to be evaluated. The description of the structure may be obtained from a computer aided drafting (CAD) file, via direct or indirect user input using any of various information handling system input devices located at either remote or local information handling systems. The description of the structure may be provided, in some embodiments, as the output of a data file from a commercially available printed circuit board design tool, or other suitable design tool known to those skilled in the art.

In some cases, the description of the structure may be provided in X-Y coordinates based on a reference point on the power plane. Alternatively, the description of the structure may be provided by referencing geometric shapes from a predefined library of shapes that may be combined to describe the shape of each structure. Various other techniques known to those skilled in the art may be used to provide a description of the structure being evaluated without departing from the spirit and scope of the present disclosure.

Upon obtaining a description of the structure, the method proceeds to 520, where the boundary of the structure is represented as a mathematical function. The boundary of the structure may be represented as a mathematical function, for example, by applying a best-fit process to the coordinates or other description obtained at 510. For example the description of the structure being evaluated may, in one embodiment, be broken into segments, with each segment being evaluated to determine the equation of a line that most closely matches a particular segment.

The segments may be combined, or evaluated separately as desired. In at least one embodiment the points representing the end points of each selected line segment may be evaluated independently to identify discontinuities. Or additional line segments including the end points of the original line segments, but having different end points than the original line segments, may be evaluated and combined to obtain a single function describing the entire boundary of a structure being evaluated. Other embodiments according to the present disclosure may compare the description obtained at 510 with a library of predefined geometric shapes, and combine equations describing multiple library shapes, or portions thereof, to arrive at a function that approximates the boundary of the structure being evaluated.

Having defined a function that describes the boundary of the structure to be evaluated, the method proceeds to 530, where the first and second derivative of the mathematical function representing the boundary of the structure are evaluated. The evaluated result of the second derivative produces a value, which may in some cases be infinity or undefined, which can be compared against the threshold value to determine the pointiness of the structure, thereby indirectly determining whether the structure is likely to be a high E-field structure.

The threshold used or the comparison is obtained by the method at 540. The threshold may be a predetermined threshold stored in a data file, which may be retrieved automatically, without any additional user intervention. In other embodiments an information handling system may obtain the threshold by prompting a user for input. The prompt may be provided upon initial execution of a program configured to perform method 500 or its equivalent, during the execution of such a program, or at another suitable time.

The threshold value may be used to set a level of structural pointiness deemed acceptable based on anticipated signal frequency, the type of insulation and/or dielectric between parallel planes within the multilayer circuit board, or other design criteria. It will be appreciated that the exact threshold used may vary significantly between different printed circuit board implementations, and possibly between implementations of various information handling systems using similar printed circuit boards. Consequently, an acceptable level of structural pointiness, and attendant E-field strength, may be determined empirically in at least some cases.

The method proceeds from 530 to 550, where the threshold obtained at 540, and the results of the evaluation of the second derivative obtained at 530, are compared. If the comparison indicates that the second derivative of the function describing the boundary of the structure exceeds the threshold obtained at 540, the method proceeds to 570, where the structure is flagged for further review. If, however, the results of the comparison at 550 indicate that the second derivative does not exceed the threshold obtained at 540, the method proceeds to 560, where the structure is marked as having passed a structural pointiness test.

It will be appreciated that, although not illustrated as part of method 500, various methods according to the present disclosure may include a manual review of structures flagged by method 500 for further review at 570, or additional automated review. It should also be appreciated that, although method 500 illustrates procedures and various parts of the method 500 as being performed in a particular order, other embodiments may be implemented according to the teachings set forth herein using additional or fewer steps, or using steps performed in a different order than that illustrated by method 500.

Figure 6:
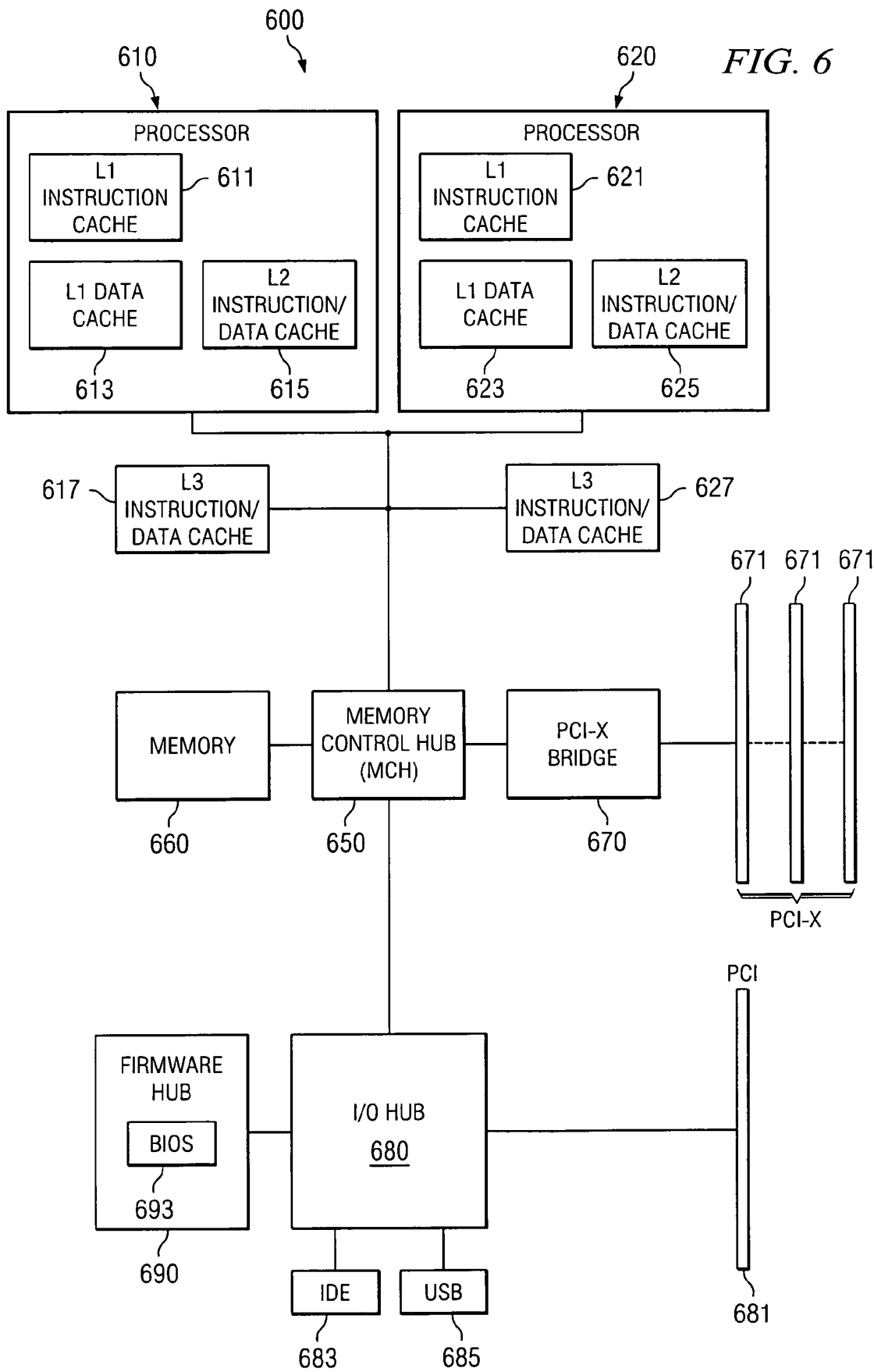
FIG. 6 is a block diagram of an information handling system that may be implemented on a multilayer motherboard having power planes with a reduced number of high E-field structures according to an embodiment of the present disclosure.

Referring next to FIG. 6, an information handling system 600 will be discussed according to an embodiment of the present disclosure. Information handling system 600 may be used to execute software implementing one or more methods as described herein, or their equivalents. Additionally, information handling system 600 may include a multilayer PCB manufactured according to one or more of the various methods described herein, resulting in a reduced number of high E-field structures. In at least one embodiment, the portions of information handling system 600 illustrated in FIG. 6 may be implemented on a motherboard constructed according to the teachings set forth in the present disclosure.

Information handling system 600 includes multiple processors 610 and 620 each including respective level 1 instruction caches 611 and 621, level 1 data caches 613 and 633, and level 2 instruction/data caches 615 and 625. Level 3 instruction/data caches 617 and 627 are also provided in information handling system 600 and may be accessed, in some embodiments, by either processor 610 or 620. In some embodiments, at least one of processors 610 and 620 may be multi-core processors, multithread processors or multi-core and multithread processors. These processors may be connected to each other, and to the level 3 instruction caches 617 and 620, via a front-side bus, which is also connected to memory controller hub 650.

Memory controller hub 650 is connected to memory 660, which may include any of various types of random access memory or other suitable memory. Memory controller hub 650 is also connected, in the illustrated embodiment, to PCI-X bridge 670 which provides bridging functions between various circuit boards or devices connected via PCI-X connectors 671. I/O hub 680 is also connected to memory control hub 650, and provides memory controller hub 650 access to various IDE devices through IDE connector 683, USB devices through USB connector 685, PCI devices through PCI connector 681. Firmware hub 690, also connected to I/O Hum 680, includes BIOS 693, which may be used to control basic input/output functions of information handling system 600.

The illustrated elements of information handling system 600 may be provided on a single multilayer motherboard. Although the interconnections illustrated in FIG. 6 are greatly simplified, the multilayer motherboard provides connections between processor 610 and 620 and various other elements illustrated in information handling system 600 over one or more layers. Power, ground, and signal planes within the motherboard may be used to provide power, return paths for power, and signal routing for various illustrated elements.

Various design constraints, including electromagnetic interference requirements of devices connected to the information handling system 600, or EMI requirements that limit the acceptable level of EMI energy produced by information handling system 600, may require some signals to be routed on particular layers of the motherboard. For example, high frequency signals on the front-side bus connecting processors 610 and 620 to memory control hub 650 may be routed between power and ground planes (not illustrated).

Although the disclosed embodiments have been described in detail, it should be understood that various changes, substitutions and alterations can be made to the embodiments without departing from their spirit and scope.

What is claimed is:

1. A method comprising:
   representing a boundary of a structure to be formed on a circuit board power plane as a function;
   evaluating a second derivative of the function;
   comparing the second derivative to a threshold; and
   response to flagging the structure, modifying the boundary if the second derivative exceeds the threshold.

2. The method of claim 1, further comprising obtaining a description of the structure from a computer aided drafting (CAD) file.

3. The method of claim 2, further comprising obtaining position coordinates associated with the boundary of the structure.

4. The method of claim 3, wherein representing the boundary of the structure comprises evaluating the position coordinates using a best-fit process.

5. The method of claim 1, further comprising representing the boundary of the structure as a boundary of a composite object comprising a plurality of geometric objects.

6. The method of claim 1, further comprising setting the threshold based, at least in part, on user input.

7. The method of claim 1, further comprising setting the threshold to a predetermined value.

8. A circuit board comprising a plurality of power planes, the circuit board produced according to a process comprising:
   representing a boundary of a structure to be formed on a power plane of the circuit board as a function;
   evaluating a second derivative of the function;
   comparing the second derivative to a threshold; and
   response to flagging the structure, modifying the boundary if the second derivative exceeds the threshold.

9. The circuit board of claim 8, wherein the process further comprises obtaining a description of the structure from a computer aided drafting (CAD) file.

10. The circuit board of claim 9, wherein the process further comprises obtaining position coordinates associated with the boundary of the structure.

11. The circuit board of claim 10, wherein representing the boundary of the structure comprises evaluating the position coordinates using a best-fit process.

12. The circuit board of claim 8, wherein the process further comprises representing the boundary of the structure as a boundary of a composite object comprising a plurality of geometric objects.

13. The circuit board of claim 8, wherein the process further comprises setting the threshold based, at least in part, on user input.

14. The circuit board of claim 8, wherein the process further comprises setting the threshold to a predetermined value.

15. An information handling system comprising at least one circuit board comprising a plurality of power planes, the circuit board produced according to a process comprising:
   obtaining a description of a boundary of a structure to be formed on a power plane of the circuit board from a computer aided drafting (CAD) file;
   representing the structure as a mathematical function;
   evaluating a second derivative of the mathematical function;
   comparing the second derivative to a threshold; and
   by response to flagging the structure, modifying the boundary if the second derivative exceeds the threshold.

16. The information handling system of claim 15, wherein the circuit board comprises a motherboard.

17. The information handling system of claim 16, wherein the process further comprises obtaining position coordinates associated with the boundary of the structure.

18. The information handling system of claim 17, wherein representing the boundary of the structure comprises evaluating the position coordinates using a best-fit process.

19. The information handling system of claim 15, wherein the process further comprises representing the boundary of the structure as a boundary of a composite object comprising a plurality of geometric objects.

20. The information handling system of claim 15, wherein the process further comprises setting the threshold based, at least in part, on user input.

21. The information handling system of claim 15, wherein the process further comprises setting the threshold to a predetermined value.

* * * * *